(12) United States Patent
Zhang et al.

(10) Patent No.: US 12,185,571 B2
(45) Date of Patent: Dec. 31, 2024

(54) DISPLAY SUBSTRATE, MANUFACTURING METHOD THEREOF AND THREE-DIMENSIONAL DISPLAY APPARATUS

(71) Applicant: BOE Technology Group Co., Ltd., Beijing (CN)

(72) Inventors: Yongfeng Zhang, Beijing (CN); Guangcai Yuan, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 332 days.

(21) Appl. No.: 17/754,225

(22) PCT Filed: May 8, 2021

(86) PCT No.: PCT/CN2021/092258
§ 371 (c)(1),
(2) Date: Mar. 28, 2022

(87) PCT Pub. No.: WO2022/134427
PCT Pub. Date: Jun. 30, 2022

(65) Prior Publication Data
US 2023/0165098 A1 May 25, 2023

(30) Foreign Application Priority Data
Dec. 23, 2020 (WO) ................ PCT/CN2020/138592
Feb. 1, 2021 (CN) ......................... 202110133787.9

(51) Int. Cl.
*H10K 59/35* (2023.01)
*G02B 30/26* (2020.01)
(Continued)

(52) U.S. Cl.
CPC ........... *H10K 50/856* (2023.02); *G02B 30/26* (2020.01); *H10K 59/124* (2023.02);
(Continued)

(58) Field of Classification Search
None
See application file for complete search history.

(56) References Cited

U.S. PATENT DOCUMENTS

2005/0057460 A1  3/2005  Lee et al.
2008/0309232 A1  12/2008 Yamamoto
(Continued)

FOREIGN PATENT DOCUMENTS

| CN | 1592518 A | 3/2005 |
|---|---|---|
| CN | 103531607 A | 1/2014 |

(Continued)

OTHER PUBLICATIONS

US Non-Final Office Action, mailed Feb. 21, 2024, from U.S. Appl. No. 17/595,644, 31 pages.

*Primary Examiner* — Shahed Ahmed
*Assistant Examiner* — Rhys Sheker
(74) *Attorney, Agent, or Firm* — Workman Nydegger

(57) ABSTRACT

The present disclosure provides a display substrate, a manufacturing method thereof and a three-dimensional display apparatus. The display substrate includes a base substrate with a plurality of sub-pixels. Each of the sub-pixels includes at least two first electrodes, and a light-emitting function layer disposed on a side of the first electrodes facing away from the base substrate. Each first electrode includes: a transparent conductive portion and a reflective conductive portion arranged in stack. In at least one of the sub-pixels, two adjacent first electrodes correspond to one reflective structure, the reflective structure includes a first portion and a second portion, an orthographic projection of
(Continued)

the first portion on the base substrate and an orthographic projection of one first electrode have an overlap area, and an orthographic projection of the second portion on the base substrate an orthographic projection of another first electrode have an overlap area.

18 Claims, 12 Drawing Sheets

(51) Int. Cl.
*H10K 50/856* (2023.01)
*H10K 59/124* (2023.01)
*H10K 59/80* (2023.01)
*H10K 59/122* (2023.01)

(52) U.S. Cl.
CPC ......... *H10K 59/353* (2023.02); *H10K 59/878* (2023.02); *H10K 59/122* (2023.02)

(56) References Cited

U.S. PATENT DOCUMENTS

| | | |
|---|---|---|
| 2015/0187858 A1 | 7/2015 | Wang et al. |
| 2017/0077200 A1 | 3/2017 | Mou et al. |
| 2018/0138245 A1 | 5/2018 | Akagawa et al. |
| 2018/0151827 A1* | 5/2018 | Kang ................ H10K 50/813 |
| 2019/0173011 A1 | 6/2019 | Kwak et al. |
| 2019/0214578 A1 | 7/2019 | Sugawara et al. |
| 2020/0251657 A1 | 8/2020 | Jongman et al. |
| 2020/0328370 A1 | 10/2020 | Lee |
| 2020/0381651 A1* | 12/2020 | Wang ................ H10K 59/122 |
| 2021/0066406 A1* | 3/2021 | Kim ................... H10K 59/353 |
| 2021/0111323 A1 | 4/2021 | Kim et al. |
| 2021/0159452 A1* | 5/2021 | Yu ..................... H10K 50/844 |
| 2022/0059631 A1 | 2/2022 | Zhang et al. |

FOREIGN PATENT DOCUMENTS

| | | |
|---|---|---|
| CN | 104201190 A | 12/2014 |
| CN | 105280684 A | 1/2016 |
| CN | 109524575 A | 3/2019 |
| CN | 110518142 A | 11/2019 |
| CN | 110808274 A | 2/2020 |
| CN | 111740035 A | 10/2020 |
| CN | 111769205 A | 10/2020 |
| KR | 1020050098532 A | 10/2005 |

* cited by examiner

DISPLAY SUBSTRATE, MANUFACTURING METHOD THEREOF AND THREE-DIMENSIONAL DISPLAY APPARATUS

CROSS REFERENCE TO RELATED APPLICATIONS

The present application is a national phase entry under 35 U.S.C. § 371 of International Application No. PCT/CN2021/092258, filed on May 8, 2021, which claims priority to the PCT Patent Application No. PCT/CN2020/138592, filed to the China National Intellectual Property Administration on Dec. 23, 2020 and entitled "ORGANIC LIGHT EMITTING DISPLAY SUBSTRATE AND DISPLAY APPARATUS", and claims priority to the Chinese Patent Application No. 202110133787.9, filed to the China National Intellectual Property Administration on Feb. 1, 2021 and entitled "DISPLAY SUBSTRATE, MANUFACTURING METHOD THEREOF AND THREE-DIMENSIONAL DISPLAY APPARATUS", a part of or entire contents of which are incorporated herein by reference.

FIELD

The present disclosure relates to the technical field of display, in particular to a display substrate, a manufacturing method thereof and a three-dimensional display apparatus.

BACKGROUND

A glasses-free three dimensional (3D) display technology can make people watch a vivid and life-like stereoscopic image without wearing 3D glasses and enables a wearer to be freed from the fetters of traditional 3D glasses, thereby fundamentally solving a problem of being dizzy due to long-time wearing of the 3D glasses and greatly improves viewing comfort of people.

According to difference of display principles, the glasses-free 3D technology may be divided into a barrier glasses-free 3D technology and a lenticular lens 3D display technology. A left view and a right view are formed via a parallax barrier similar to a grating or via a lenticular lens, the left view and the right view come into two eyes of the viewer with a parallax effect, so that the viewer can watch a 3D display image without the need for the viewer to wear 3D glasses.

SUMMARY

In an aspect, an embodiment of the present disclosure provides a display substrate, including:
  a base substrate, wherein the base substrate includes a plurality of sub-pixels, each sub-pixel includes at least two first electrodes and a light-emitting function layer disposed on a side of the first electrodes facing away from the base substrate, and each first electrode includes: a transparent conductive portion and a reflective conductive portion which are arranged in stack;
  an insulation layer, located between a layer where the first electrodes are located and the base substrate; and
  a plurality of reflective structures, located between the insulation layer and the base substrate, wherein
  in at least one of the sub-pixels, two adjacent first electrodes are correspondingly provided with one reflective structure, the reflective structure includes a first portion and a second portion, an orthographic projection of the first portion on the base substrate and an orthographic projection of one of the two adjacent first electrodes on the base substrate have an overlap area, and an orthographic projection of the second portion on the base substrate and an orthographic projection of another one of the two adjacent first electrodes on the base substrate have an overlap area.

Optionally, in the above display substrate provided by the embodiment of the present disclosure, each of the reflective structures further includes a third portion, a distance between the third portion and the light-emitting function layer in a direction perpendicular to the base substrate is smaller than a distance between the first portion and the light-emitting function layer in the direction perpendicular to the base substrate and smaller than a distance between the second portion and the light-emitting function layer in the direction perpendicular to the base substrate.

Optionally, in the above display substrate provided by the embodiment of the present disclosure, the third portion is located between the first portion and the second portion.

Optionally, in the above display substrate provided by the embodiment of the present disclosure, an orthographic projection of the reflective conductive portion on the base substrate is located within an orthographic projection of the transparent conductive portion on the base substrate.

Optionally, in the above display substrate provided by the embodiment of the present disclosure, the transparent conductive portion includes: a first transparent conductive portion disposed on a side of the reflective conductive portion facing the base substrate, and a second transparent conductive portion disposed on a side of the reflective conductive portion facing away from the base substrate, wherein
  a portion of each second transparent conductive portion exceeding the reflective conductive portion includes: a slope obliquely extending towards the base substrate, and an edge flat portion making contact with the slope.

Optionally, the above display substrate provided by the embodiment of the present disclosure further includes: a plurality of transparent protective electrodes disposed on a side of the layer where the plurality of first electrodes are located facing away from the base substrate, where
  the plurality of transparent protective electrodes correspond to the plurality of first electrodes, and an orthographic projection of the transparent protective electrodes on the base substrate at least covers an orthographic projection of the edge flat portions in the corresponding first electrodes on the base substrate.

Optionally, in the above display substrate provided by the embodiment of the present disclosure, in each of the sub-pixels, the at least two first electrodes are arranged in a first direction and extend in a second direction; and
  a width of the transparent protective electrode in the first direction is larger than or equal to a width of the corresponding first electrode in the first direction, and a length of the transparent protective electrode in the second direction is larger than or equal to a length of the corresponding first electrode in the second direction.

Optionally, the above display substrate provided by the embodiment of the present disclosure further includes: a planarization layer located between the base substrate and a layer where the plurality of reflective structures are located; and the reflective structures are arranged in grooves of the planarization layer.

Optionally, the above display substrate provided by the embodiment of the present disclosure further includes: a plurality of pixel driving circuits located between the base substrate and the planarization layer. Here the pixel driving circuits are corresponding electrically connected to the first electrodes through via holes running through an inorganic insulation layer and the planarization layer.

Optionally, in the above display substrate provided by the embodiment of the present disclosure, the via holes are sequentially arranged at edges of the same side of the corresponding first electrodes in the first direction.

Optionally, in the above display substrate provided by the embodiment of the present disclosure, in a direction perpendicular to the base substrate, a thickness of the reflective conductive portion is larger than or equal to 200 Å and smaller than or equal to 2000 Å.

Optionally, in the above display substrate provided by the embodiment of the present disclosure, on a side close to the reflective conductive portion, an included angle between the slope and the base substrate is larger than or equal to 30º and smaller than or equal to 60°.

Optionally, in the above display substrate provided by the embodiment of the present disclosure, in each of the sub-pixels, a maximum distance between the first portion and the second portion is larger than 2 μm and smaller than or equal to 5 μm, a minimum distance between the first portion and the second portion is larger than 1 μm and smaller than or equal to 2 μm, and a gap between the transparent protective electrodes is larger than 0 and smaller than or equal to 2 μm.

Optionally, in the above display substrate provided by the embodiment of the present disclosure, a material of the insulation layer is an inorganic insulation material.

In another aspect, an embodiment of the present disclosure further provides a three-dimensional display apparatus, including the above display substrate, and a spectrometer located on a display side of the display substrate.

Further, in another aspect, an embodiment of the present disclosure further provides a manufacturing method of the above display substrate, including:

providing a base substrate;

forming a plurality of reflective structures on the base substrate;

forming an insulation layer on a layer where the plurality of reflective structures are located; and forming a plurality of sub-pixels on the insulation layer;

wherein in each of the sub-pixels, at least two first electrodes and a light-emitting function layer disposed on a side of the at least two first electrodes facing away from the base substrate are formed; each first electrode comprises: a transparent conductive portion and a reflective conductive portion arranged in stack; and in at least one of the sub-pixels, two adjacent first electrodes are correspondingly provided with one reflective structure, the one reflective structure comprises a first portion and a second portion, an orthographic projection of the first portion on the base substrate and an orthographic projection of one of the two adjacent first electrodes on the base substrate have an overlap area, and an orthographic projection of the second portion on the base substrate and an orthographic projection of another one of the two adjacent first electrodes on the base substrate.

Optionally, in the above manufacturing method provided by the embodiment of the present disclosure, the forming the plurality of first electrodes specifically includes:

forming a first transparent conductive material layer, a reflective conductive material layer and a second transparent conductive material layer on the insulation layer in sequence; and etching the first transparent conductive material layer, the reflective conductive material layer and the second transparent conductive material layer by using the same etching process so as to form a plurality of first electrodes;

each first electrode includes the first transparent conductive portion, the reflective conductive portion and the second transparent conductive portion, wherein a portion of the second transparent conductive portion exceeding the reflective conductive portion includes: a slope obliquely extending towards the base substrate, and an edge flat portion making contact with the slope and the first transparent conductive portion; and in the same sub-pixel, all the first electrodes are arranged in the first direction and extend in the second direction.

Optionally, in the above manufacturing method provided by the embodiment of the present disclosure, after forming the plurality of first electrodes and before forming the light-emitting function layer, the method further includes:

forming a plurality of transparent protective electrodes on one side of a layer where the first electrodes are located facing away from the base substrate;

where the plurality of transparent protective electrodes correspond to the plurality of first electrodes, a width of each transparent protective electrode in the first direction is larger than a width of the corresponding first electrode in the first direction, and a length of the transparent protective electrode in the second direction is larger than a length of the corresponding first electrode in the second direction.

DETAILED DESCRIPTION

Figure 1:
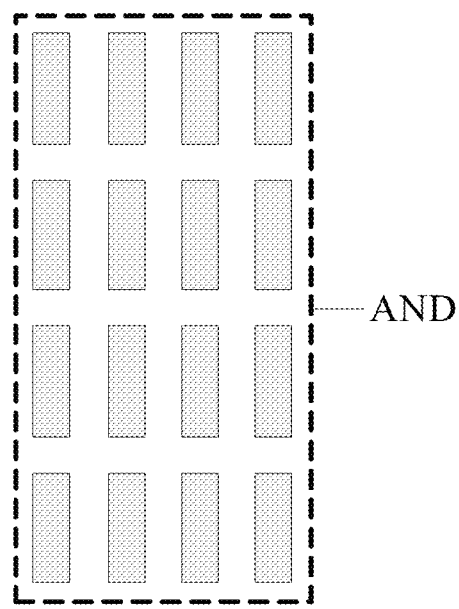
FIG. 1 is a schematic diagram of a structure of a single-layer anode in the related art.

In order to make objectives, technical solutions and advantages of embodiments of the present disclosure clearer, the technical solutions of the embodiments of the present disclosure will be described clearly and completely below with reference to the drawings of the embodiments of the present disclosure. It needs to be noted that a size and shape of each figure in the drawings do not reflect a true scale and intend to only illustrate contents of the present disclosure. The same or similar reference number represents the same or similar element or an element with the same or similar function all the time. Apparently, the described embodiments are a part of, but not all, of the embodiments of the present disclosure. Based on the described embodiments of the present disclosure, all other obtained embodiments obtained by those ordinarily skilled in the art on the premise of no creative work fall within the protection scope of the present disclosure.

Unless otherwise defined, technical or scientific terms used herein should be understood commonly by those ordinarily skilled in the art. "First", "second" and similar words used in the specification and claims of the present disclosure do not represent any sequence, quantity or significance but are only used for distinguishing different components. "Include" or "contain" and the similar words means that an element or item preceding the word covers an element or item and their equivalents listed after the word without excluding other elements or items. "Inside", "outside", "up", "down" and the like are only used for representing a relative position relation. When an absolute position of a described object changes, the relative position relation may change correspondingly.

Existing glasses-free 3D products in medium and large sizes are low in resolution and cannot realize high-definition, high-brightness and high-contrast displaying. In order to improve a 3D viewing effect, the quantity of view points needs to be added, and the more individually-controlled sub-pixels there are, the higher the 3D display resolution gets, and the better the display effect is.

Figure 2:
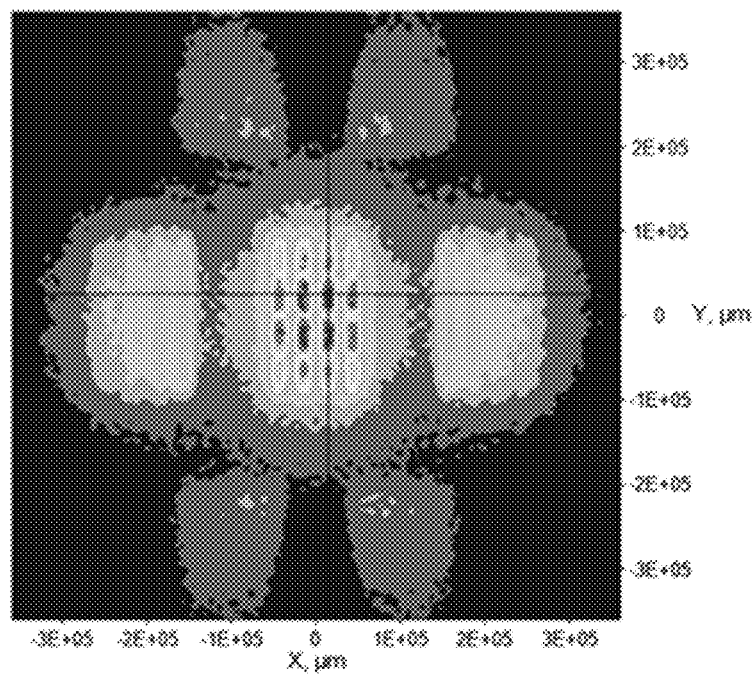
FIG. 2 is a schematic diagram of a moire pattern of the single-layer anode shown in FIG. 1.

In some embodiments, as shown in FIG. 1, on the basis of sub-pixels, anodes AND of the sub-pixels may be finely patterned again into a plurality of sub-anodes independent from each other, full-gray-scale displays and control over the sub-anodes are realized respectively through connection to the independent pixel driving circuits and compensation circuits, thus, 3D display resolution is improved, the quantity of viewing angles is increased, hopping of different viewing angles is smoother, and watching experience of glasses-free 3D is improved. However, the present disclosure discovers that after the anodes of the sub-pixels are divided, there is no carrier mobile coupled luminescence driven by parallel electric field generated by a metal electrode at spaces between adjacent sub-anodes (that is, no luminescence at the space), unfavorable 3D display moire is caused, the larger the space is, the wider a non-luminescence region gets, and the more severe the 3D display moire is, as shown in FIG. 2.

Figure 3:
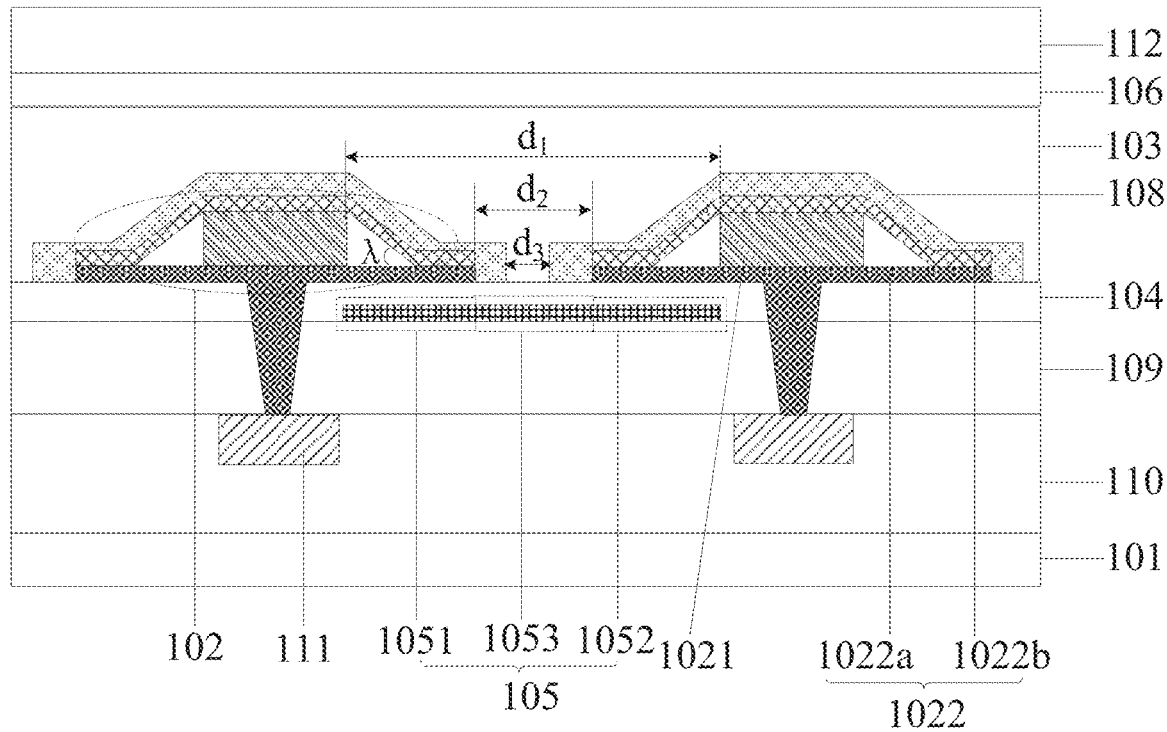
FIG. 3 is a schematic structural diagram of a display substrate provided by an embodiment of the present disclosure.
Figure 4:
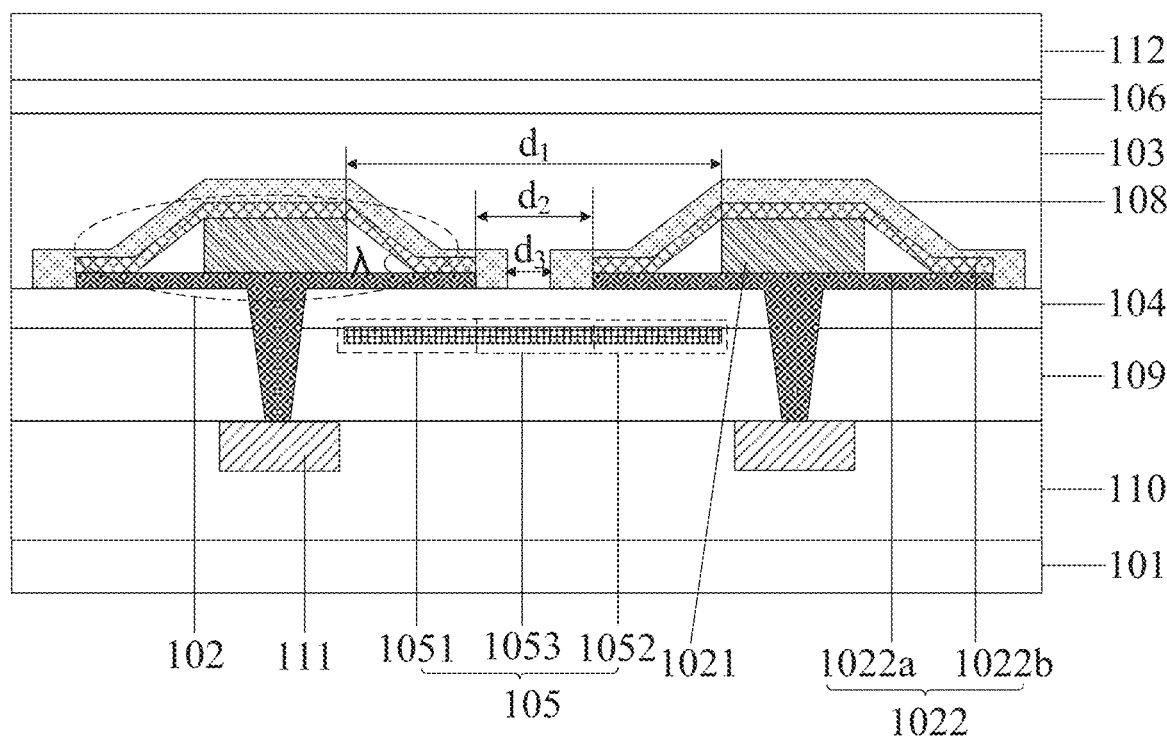
FIG. 4 is another schematic structural diagram of a display substrate provided by an embodiment of the present disclosure.
Figure 5:
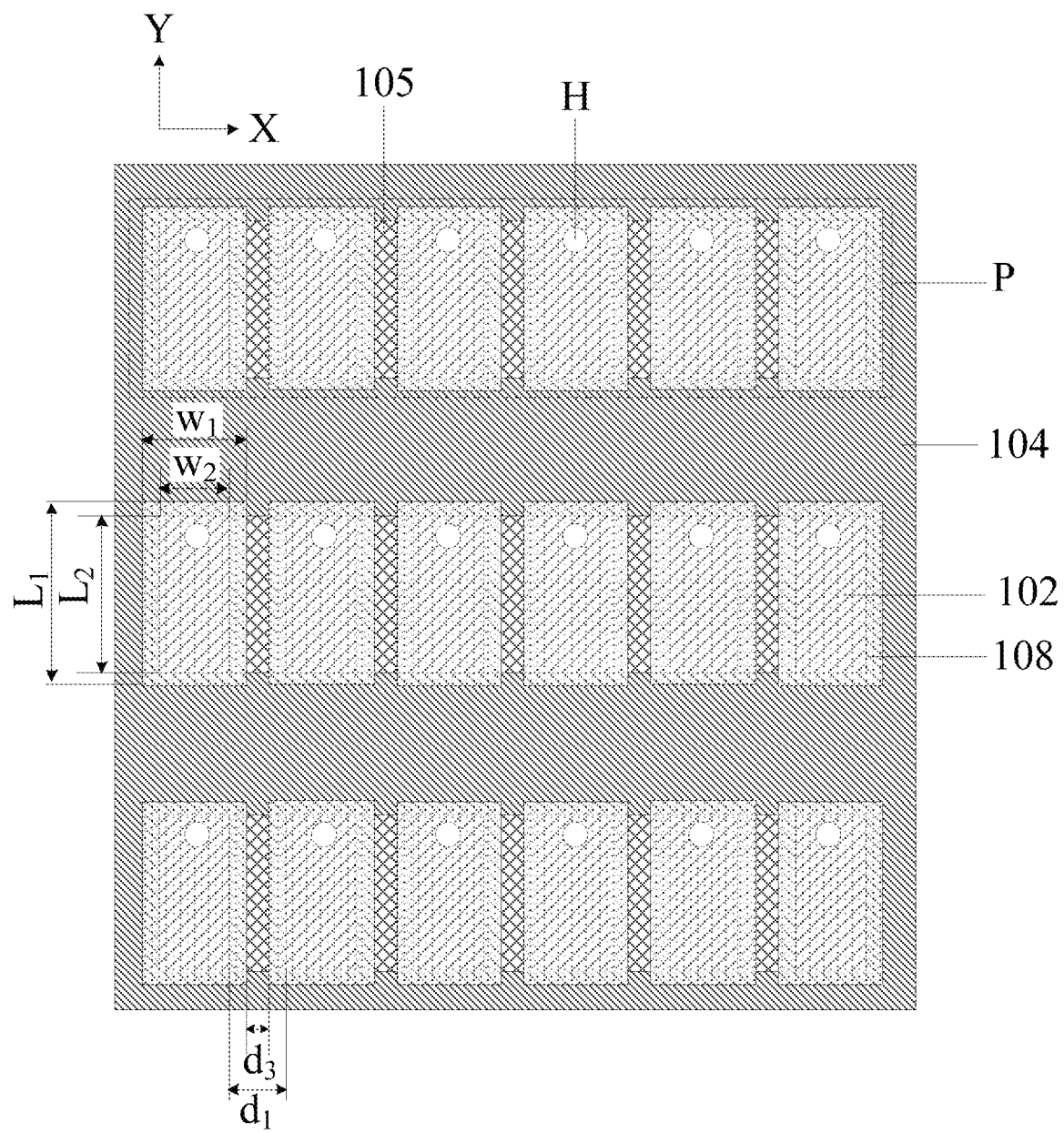
FIG. 5 is further, another schematic structural diagram of a display substrate provided by an embodiment of the present disclosure.

As for the above problem in the related art, an embodiment of the present disclosure provides a display substrate, as shown in FIG. 3 to FIG. 5. The display substrate may include:

a base substrate 101, wherein the base substrate 101 includes a plurality of sub-pixels P, the plurality of sub-pixels P may include but are not limited to a red-light sub-pixel, a green-light sub-pixel, a blue-light sub-pixel and a white-light sub-pixel, each of the sub-pixels P internally includes at least two first electrodes 102, and a light-emitting function layer 103 on a side of the at least two first electrodes 102 facing away from the base substrate 101, each first electrode 102 includes: a reflective conductive portion 1021 and a transparent conductive portion 1022 arranged in stack; in some embodiments, a pixel definition layer (PDL) including a plurality of openings is disposed on the base substrate 101, each of the openings corresponds to a sub-pixel P, the first electrodes 102 exposed via one opening belongs to one sub-pixel P, and each opening may expose the entire or a part of each first electrode 102;

an insulation layer 104, disposed between a layer where the first electrodes 102 are located and the base substrate 101; and a plurality of reflective structures 105, disposed between the insulation layer 104 and the base substrate 101.

In at least one of the sub-pixels P, two adjacent first electrodes 102 are correspondingly provided with one reflective structure 105, the reflective structure 105 includes a first portion 1051 and a second portion 1052, an orthographic projection of the first electrode 1051 on the base substrate 101 and an orthographic projection of the one first electrode 102 on the base substrate 101 have an overlap area, and an orthographic projection of the second portion 1052 on the base substrate 101 and an orthographic projection of another first electrode 102 on the base substrate 101 have an overlap area.

In the above display substrate provided by the embodiment of the present disclosure, through the reflective structures 105 and the insulation layer 104, mutual insulation between the first electrodes 102 and the reflective structures 105 is realized, optimal microcavity (defined by the reflective structures 105 and a second electrode 106) gain of a light-emitting device in the gap by adjusting a thickness of the insulation layer 104, a light-emitting brightness at the gap is improved, and unfavorable moire caused by large etching gap is solved.

In some embodiments, the thickness of the insulation layer 104 is in a negative correlation relation with reflectivity of the reflective structures 105. In other words, under the condition of realizing the same microcavity gain effect, the larger the reflectivity of the reflective structures 105 is, the smaller the thickness of the insulation layer 104 will be. In order to realize a light and thin product, aluminum, or silver and other metal with high reflectivity (for example, the reflectivity is larger than 90%) may be adopted to manufacture the reflective structures 105. Besides, a material of the inorganic insulation layer 104 may be an inorganic material such as silicon oxide, silicon nitride, silicon oxynitride, aluminum oxide and the like.

In some embodiments, the first electrode 102 may be an anode, the second electrode 106 may be a cathode; or the first electrode 102 may be a cathode, and the second electrode 106 may be an anode. In some embodiments, the plurality of sub-pixels P are in a plurality of colors, in this case, the light-emitting function layer 103 in each of the sub-pixels P may be of an integrated structure. In some embodiment, all the sub-pixels P are in the same color (for example, white), so the light-emitting function layer 103 in all the sub-pixels P may be of an integrated structure. The light-emitting function layer 103 may include a hole injection layer, a hole transport layer, an electronic barrier layer, a light-emitting material layer, a hole blocking layer, an electron transfer layer and an electron injection layers, and the like.

Besides, in the present disclosure, the reflective conductive portion 1021 refers to a conductive component with a reflecting function, for example, metal such as aluminum, silver, etc. and an alloy material with high reflectivity, and the transparent conductive portion 1022 refers to a conductive component with a transparent function, for example, a metal oxide such as indium tin oxide or a metal material which gets thinner and can make light pass through it.

Optionally, in the above display substrate provided by the embodiment of the present disclosure, as shown in FIG. 3 to FIG. 5, each of the reflective structures 105 further includes a third portion 1053, a distance between the third portion 1053 and the light-emitting function layer 103 in a direction perpendicular to the base substrate 101 is smaller than a distance between the first portion 1051 and the light-emitting function layer 103 in the direction perpendicular to the base substrate 101 and smaller than a distance between the second portion 1052 and the light-emitting function layer 103 in the direction perpendicular to the base substrate 101, and third portion 1053 may be located between the first portion 1051 and the second portion 1052. In this way, an orthographic projection of the reflective structures 105 on the base substrate 101 may approximately overlap with a gap between the reflective conductive portions 1021, so that coupling capacitance caused by overlapping of the reflective structures 105 and the reflective conductive portions 1021 can be reduced as much as possible.

It needs to be noted that in an actual technique, due to limit of technical conditions or other factors, the above "approximately overlap" may be "completely overlap", or may have some deviation, so a relation of "approximately overlap" between the above features falls within the protection scope of the present disclosure as long as it meets a permissible error.

In some embodiments, the first portion 1051, the second portion 1052 and the third portion 1053 may be of an integrated structure arranged in the same layer, or may be three independent portions arranged on different layers. Preferably, in order to improve flatness of the subsequent first electrodes 102, the first portion 1051, the second portion 1052 and the third portion 1053 are of an integrated structure arranged in the same layer.

It needs to be noted that in the present disclosure, the "same layer" refers to a layer structure formed through a one-time patterning process by using the same mask after forming a film layer by using the same film forming process. That is, the one-time patterning process corresponds to one mask (also called photomask). According to difference of specific patterns, the one-time patterning process may include repeated exposure, developing or etching processes, the specific patterns in the formed layer structure may be continuous or not, and these specific patterns may be located at the same height or have the same thickness, or may be at different heights or have different thicknesses.

Optionally, in the above display substrate provided by the embodiment of the present disclosure, as shown in FIG. 3 and FIG. 4, an orthographic projection of the reflective conductive portion 1021 on the base substrate 101 is located within an orthographic projection of the transparent conductive portion 1022 on the base substrate 101, so that the reflective conductive portion 1021 is protected against erosion of water, oxygen, etc. by the aid of the transparent conductive portion 1022.

Optionally, in the above display substrate provided by the embodiment of the present disclosure, as shown in FIG. 3 and FIG. 4, the transparent conductive portion 1022 may include: a first transparent conductive portion 1022a disposed on a side of the reflective conductive portion 1021 facing the base substrate 101, and a second transparent conductive portion 1022b disposed on a side of the reflective conductive portion 1021 facing away from the base substrate 101.

Here, a portion of each second transparent conductive portion 1022b exceeding the reflective conductive portion 1021 includes: a slope obliquely extending towards the base substrate 101, and an edge flat portion in contact with the slope.

As shown in FIG. 3 and FIG. 4, during forming of the light-emitting function layer 103 of a light-emitting device, the slope of the second transparent conductive portion 1022b is relatively smooth and has no vertical segment difference, so the light-emitting function layer 103 does not crack at a gap. In the light-emitting device, a hole (for example, an anode) of the first electrode 102 and an electron (for example, a cathode) of the second electrode 106 are transported to a light-emitting layer to emit light by combination. As a carrier concentration in the light-emitting layer corresponding to the first electrode 102 is higher than a carrier concentration at a gap, carriers may be transversely diffused from a region of higher concentration to a region of lower concentration, thus light-emitting brightness at the gap is increased by using intrinsic crosstalk of the light-emitting device, then continuous light-emitting in the same sub-pixel P is realized, and a phenomenon of moire is further reduced.

In some embodiments, materials of the first transparent conductive portion 1022a and the second transparent conductive portion 1022b may be indium tin oxide (ITO), and a material of the reflective conductive portion 1021 may be silver (Ag), that is, the first electrode 102 has an ITO/Ag/ITO sandwich. Compared with a stack structure such as Al/ITO, and AlNd/ITO, an anode reflectivity of the ITO/Ag/ITO sandwich is higher, a current efficiency of a corresponding light-emitting device is higher, and a service life is longer.

In some embodiments, the slope of the second transparent conductive portion 1022b may be in contact with the first transparent conductive portion 1022a, and the edge flat portion of the second transparent conductive portion 1022b may overlap with the first transparent conductive portion 1022a. In some other embodiments, the first transparent conductive portion 1022a is located within the orthographic projection of the second transparent conductive portion 1022b, and the edge flat portion of the second transparent conductive portion 1022b is in contact with the insulation layer 104.

Figure 6:
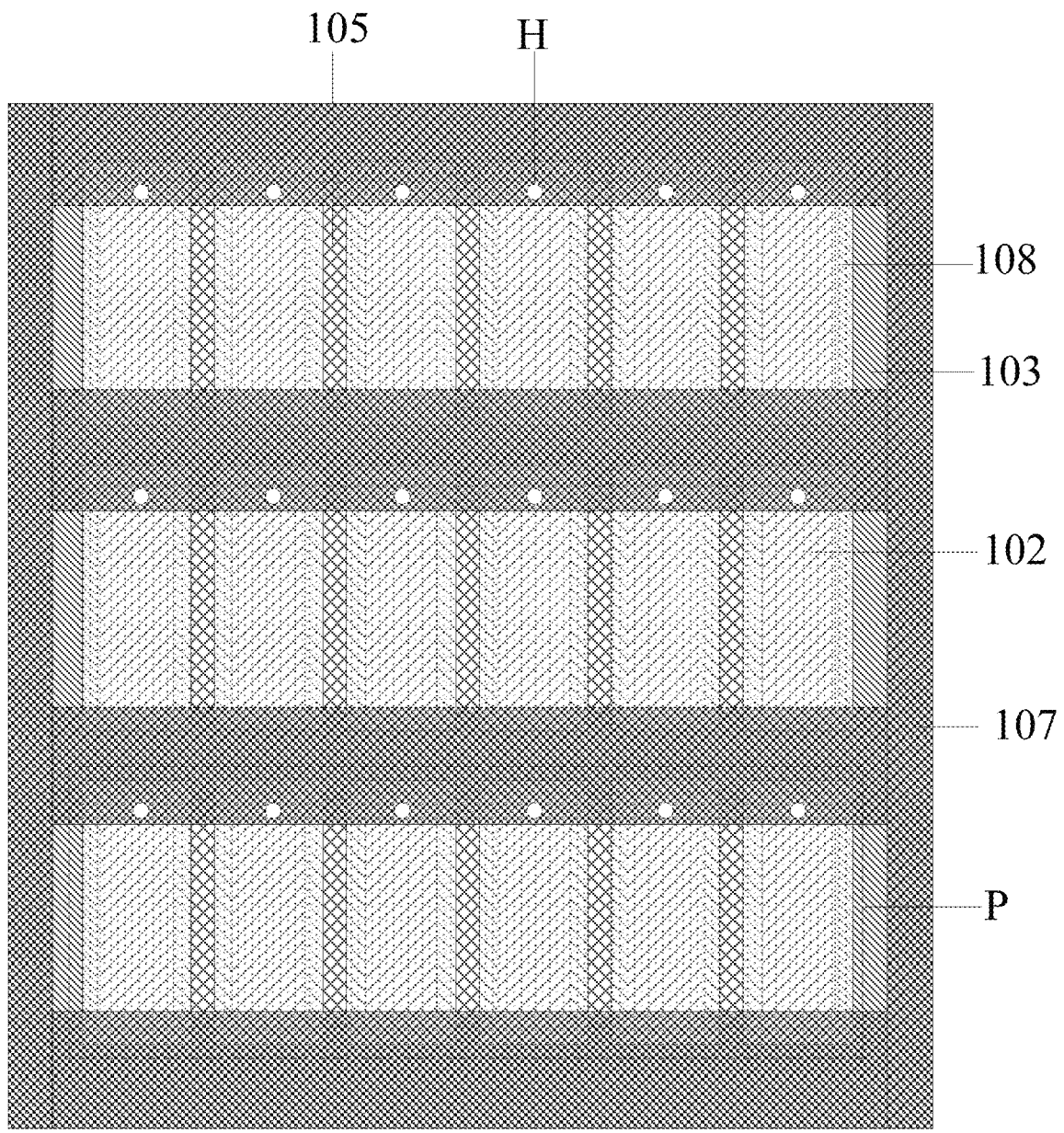
FIG. 6 is yet another schematic structural diagram of a display substrate provided by an embodiment of the present disclosure.

In the present disclosure, as shown in FIG. 6, a pixel defining layer 107 is arranged between the adjacent sub-pixels P, and in order to realize continuous light-emitting, the pixel defining layer 107 cannot be arranged at a gap between the adjacent first electrodes 102. As the first transparent conductive portion 1022a and the second transparent conductive portion 1022b are two independent film layers, a seam of a certain degree may exist between them. During subsequent manufacturing of the pixel defining layer 107, a curing process (230° C./1 hour) tends to make water, oxygen, etc. enter the first electrode 102 through the seam and erode an edge of the reflective conductive portion 1021 made of the silver material, edge burrs are generated, and consequently serious electric leakage of the light-emitting device is caused.

Based on this, the above display substrate provided by the embodiment of the present disclosure, as shown in FIG. 3 and FIG. 4, may further include: a plurality of transparent protective electrodes 108 disposed on a side of the layer where the plurality of first electrodes 102 are located facing away from the base substrate 101.

The plurality of transparent protective electrodes 108 correspond to the plurality of first electrodes 102, and an orthographic projection of the transparent protective electrodes 108 on the base substrate 101 at least covers an orthographic projection of the edge flat portions of the second transparent protective electrodes 1022b in the corresponding first electrodes 102 on the base substrate 101.

The edge flat portions of the second transparent conductive portions 1022b are in contact with edges of the first transparent conductive portions 1022a, by arranging the transparent protective electrodes 108 covering the edge flat portions, water, oxygen, etc. is prevented from entering the first electrodes 102 through seams at edges of the first transparent conductive portions 1022a and the second transparent conductive portions 1022b, so that it can be guaranteed that the edges of the reflective conductive portions 1021 are not eroded during subsequent manufacturing of the pixel defining layer 107, and stability of the light-emitting device is improved. In some embodiments, the material of the transparent protective electrode 108 may be indium tin oxide, etc.

It needs to be noted that under the condition that the transparent protective electrodes 108 are conductive and directly cover the first electrodes 102, in order to avoid crosstalk of loaded driving signals on the different first electrodes 102, the transparent protective electrodes 108 may correspond to the first electrodes 102 in one-to-one mode. Under the condition that there is an insulation layer at the edges of the transparent protective electrodes 108, or between the transparent protective electrodes 108 and the first electrodes 102, one transparent protective electrode 108 may correspond to and cover a plurality of first electrodes 102.

Optionally, in the above display substrate provided by the embodiment of the present disclosure, as shown in FIG. 5, in each of the sub-pixels P, at least two first electrodes 102 are arranged in the first direction X and extend in the second direction Y, a width $W_1$ of the transparent protective electrode 108 in the first direction X is larger than or equal to a width W2 of the corresponding first electrode 102 in the first direction X, a length $L_1$ of the transparent protective electrode 108 in the second direction Y is larger or equal to a length $L_2$ of the corresponding first electrode 102 in the second direction Y, so that the first electrode 102 may be better protected, which also facilitates the film layer continuity of the subsequent light-emitting function layer 103.

Specifically, in the present disclosure, the width W2 of the first electrode 102 in the first direction X is the maximum width value among the first transparent conductive portion 1022a, the second transparent conductive portion 1022b and the reflective conductive portion 1021. For example, in the first direction X, a width of the first transparent conductive portion 1022a is larger than a width of the second transparent conductive portion 1022b and larger than a width of the reflective conductive portion 1021, so the width W2 of the first electrode 102 in the first direction X refers to the width of the first transparent conductive portion 1022a. Similarly, the length $L_2$ of the first electrode 102 in the second direction Y is the maximum length value among the first transparent conductive portion 1022a, the second transparent conductive portion 1022b and the reflective conductive portion 1021.

Optionally, the display substrate provided by the embodiment of the present disclosure, as shown in FIG. 4, may further include: a planarization layer 109 between the base substrate 101 and a layer where the plurality of reflective structures 105 are located; the planarization layer 109 has a plurality of grooves, the reflective structures 105 are arranged in the grooves of the planarization layer 109, and thus flatness of the edge of the first electrode 102 is improved.

In some embodiments, in order to effectively improve the flatness of the edge of the first electrode 102 and solve a problem of abnormal light-emitting direction caused by unevenness of a surface of the first electrode 102, as shown in FIG. 4, a distance between top edges of the grooves of the planarization layer 109 and the base substrate 101 may be set to be equal to a distance between upper surfaces of the reflective structures 105 and the base substrate 101, that is, the grooves of the planarization layer 109 just accommodate the reflective structures 105.

Optionally, the above display substrate provided by the embodiment of the present disclosure, as shown in FIG. 3 and FIG. 4, may further include: a plurality of pixel driving circuits 110 located between the base substrate 101 and the planarization layer 109. The pixel driving circuit 110 (may be, specifically, a source/drain electrode 111 of a driving transistor in the pixel driving circuit 110) are correspondingly electrically connected to the first electrodes 102 through via holes H running through the insulation layer 104 and the planarization layer 109. In this way, the light-emitting device to which the corresponding first electrode 102 belongs can be independently driven through the pixel driving circuit 110 to emit light. In some embodiments, in order to improve 3D display resolution, each pixel driving circuit 110 may be arranged to be correspondingly electrically connected to one first electrode 102.

Optionally, in the above display substrate provided by the embodiment of the present disclosure, as shown in FIG. 5, in order to simplify a manufacturing process, the via holes H may be arranged at the edge of the same side of the corresponding first electrodes 102 in sequence in the first direction X.

Optionally, in the above display substrate provided by the embodiment of the present disclosure, a slope inclination of the second transparent conductive portion 1022b may be changed by adjusting a thickness of the reflective conductive portion 1021. In some embodiments, in the direction perpendicular to the base substrate 101, the thickness of the reflective conductive portion 1021 may be larger than or equal to 200 Å and smaller than or equal to 2000 Å.

Optionally, in the above display substrate provided by the embodiment of the present disclosure, as shown in FIG. 3, on a side close to the reflective conductive portion 1021, an included angle k between the slope and the base substrate 101 may be larger than or equal to 300 and smaller than or equal to 60°. In this way, adjustment of a light-emitting direction of the light-emitting device can be better realized by using the oblique slope, so that "fake" continuous light-emitting is realized on the basis of optical crosstalk of adjacent light-emitting devices.

Optionally, in the above display substrate provided by the embodiment of the present disclosure, as shown in FIG. 3 and FIG. 5, in each of the sub-pixels P, a maximum distance $d_1$ (namely, a gap between the reflective conductive portions 1021) between the first portion 1051 and the second portion 1052 is larger than 2 μm and smaller than or equal to 5 μm, a minimum distance $d_2$ (namely, a gap between the transparent conductive portions 1022) between the first portion 1051 and the second portion 1052 is larger than 1 μm and smaller than or equal to 2 μm, and the gap between the transparent protective electrodes 108 is larger than 0 and smaller than or equal to 2 μm.

In some embodiments, as shown in FIG. 5, one row of first electrodes 102 is arranged in one sub-pixel P, in this case, the above $d_1$, $d_2$ and $d_3$ specifically refer to sizes in the first direction X. In some embodiments, a plurality of rows and columns of first electrodes 102 may be arranged in the sub-pixel P, and in this case, the above $d_1$, $d_2$ and $d_3$ specifically refer to sizes in the first direction X and the second direction Y.

Optionally, the above display substrate provided by the embodiment of the present disclosure, as shown in FIG. 3 and FIG. 4, may further include an encapsulation layer 112, etc. In some embodiments, the encapsulation layer 112 may include a first inorganic encapsulation layer, an organic encapsulation layer and a second inorganic encapsulation layer arranged in stack. Other essential components of the display substrate should be understood by those ordinarily skilled in the art and will neither be described in detail, nor be used to limit the present disclosure.

Based on the same inventive concept, an embodiment of the present disclosure further provides a manufacturing method of the above display substrate. As a principle of solving problems of the manufacturing method is similar to a principle of solving problems of the above display substrate, implementation of the manufacturing method provided by the embodiment of the present disclosure may refer to implementation of the above display substrate provided by the embodiment of the present disclosure, and repetitions are not described in detail.

Figure 7:
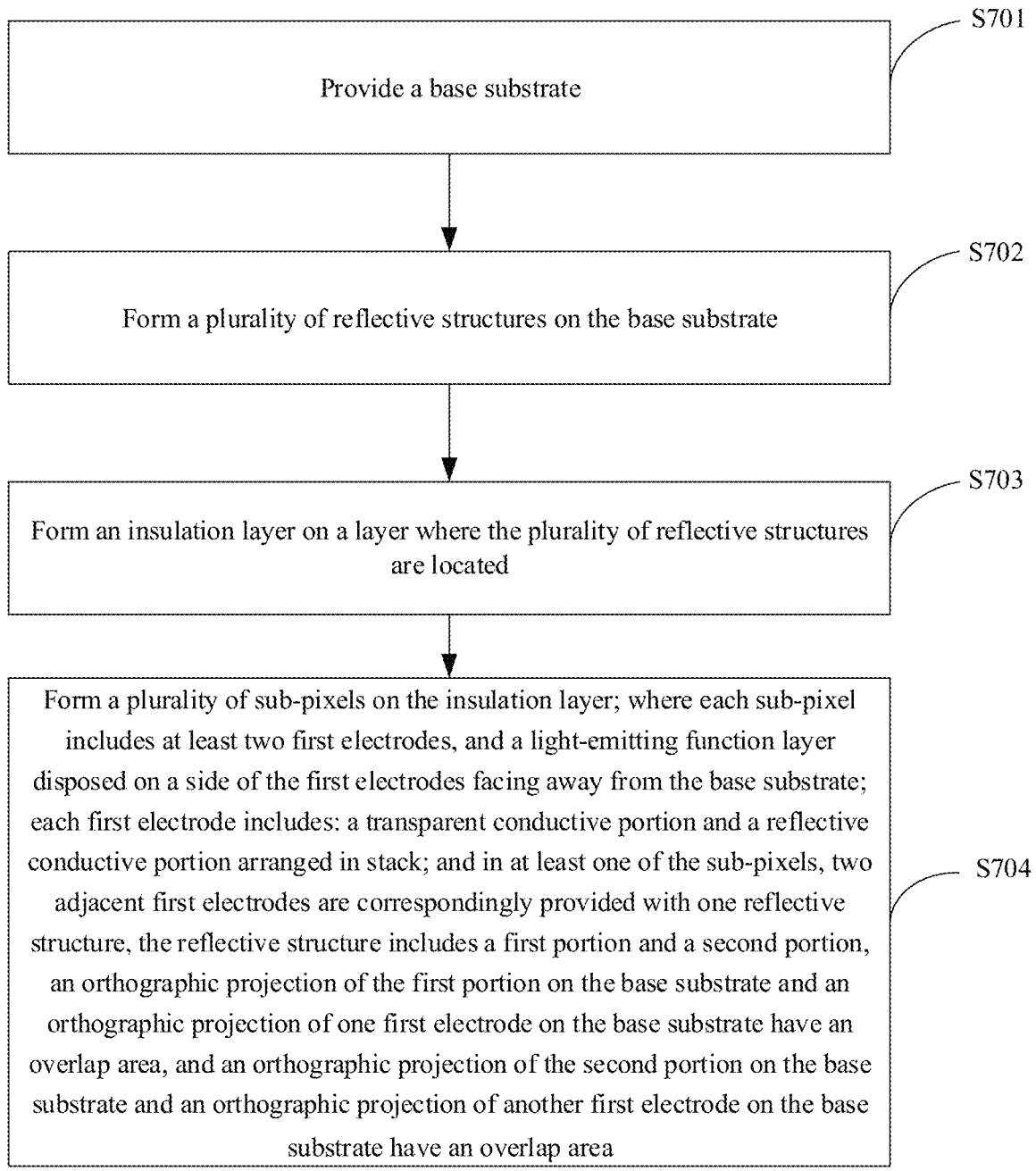
FIG. 7 is a flowchart of a manufacturing method of a display substrate provided by an embodiment of the present disclosure.

Specifically, the manufacturing method of the above display substrate provided by the embodiment of the present disclosure, as shown in FIG. 7, may include the following:

S701, providing a base substrate;
S702, forming a plurality of reflective structures on the base substrate;
S703, forming an insulation layer on a layer where the plurality of reflective structures are located; and
S704, forming a plurality of sub-pixels on the insulation layer; where each of the sub-pixels includes at least two first electrodes, and a light-emitting function layer disposed on a side of the first electrodes facing away from the base substrate; and each first electrode includes: a transparent conductive portion and a reflective conductive portion disposed in stack.

In at least one of the sub-pixels, two adjacent first electrodes correspond to one reflective structure, the reflective structure includes a first portion and a second portion, an orthographic projection of the first portion on the base substrate and an orthographic projection of one first electrode on the base substrate have an overlap area, and an orthographic projection of the second portion on the base substrate and an orthographic projection of another first electrode on the base substrate have an overlap area.

In order to better understand the technical solution of the manufacturing method of the present disclosure, detailed description is made below by taking a specific embodiment.

Figure 8:
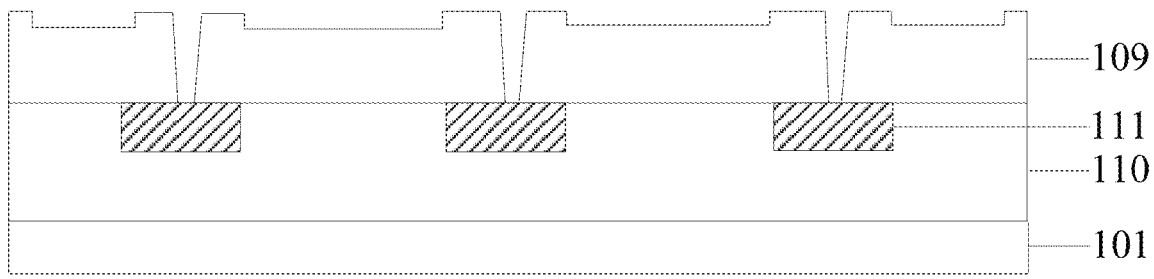
FIG. 8 to FIG. 22 are schematic structural diagrams showing the structure of the display substrate in a manufacturing process provided by the embodiment of the present disclosure respectively.
Figure 9:
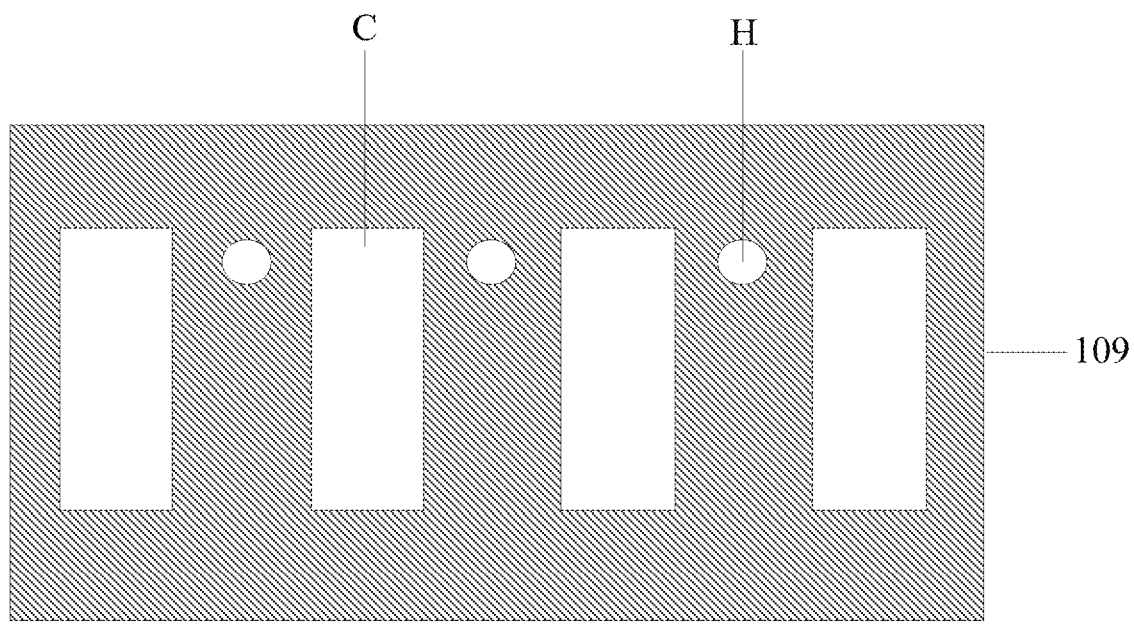
Figure 10:
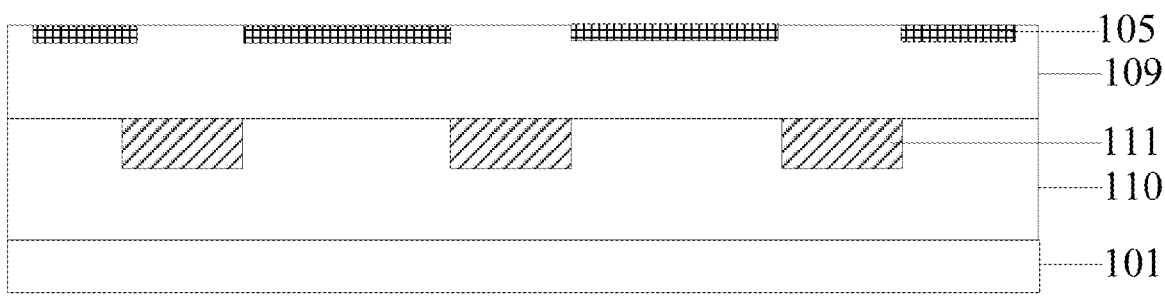
Figure 11:
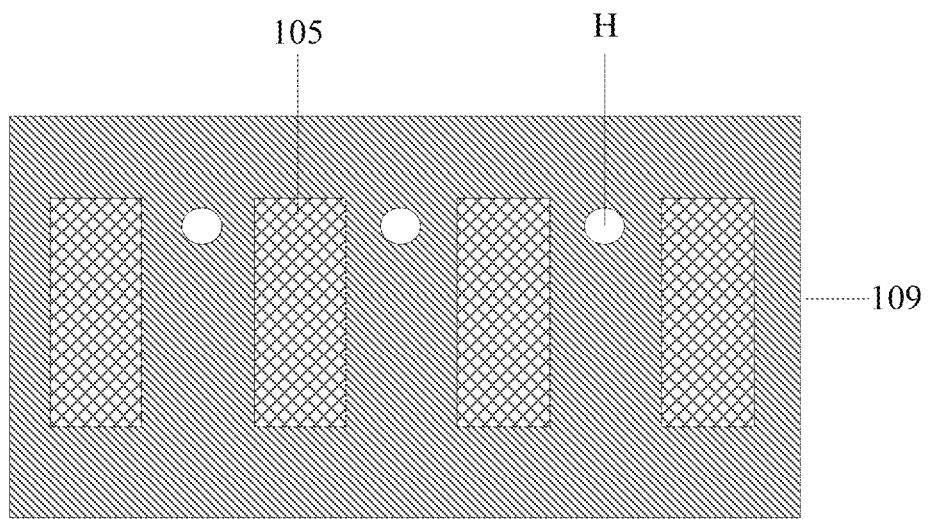
Figure 12:
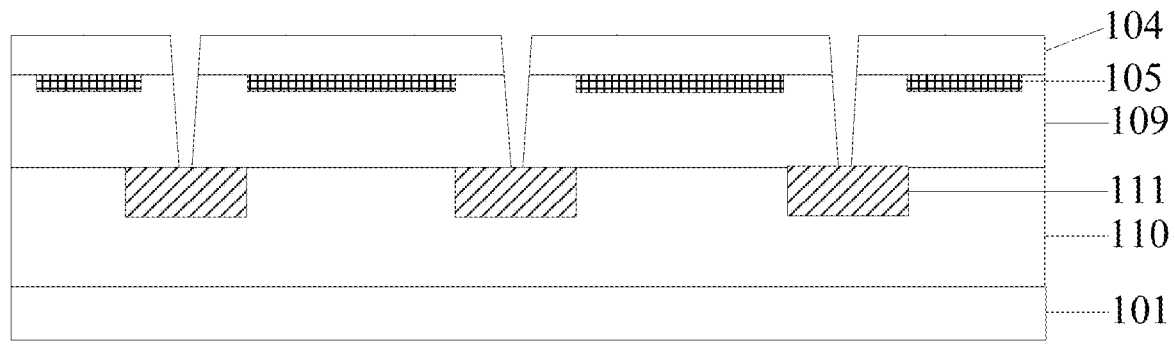
Figure 13:
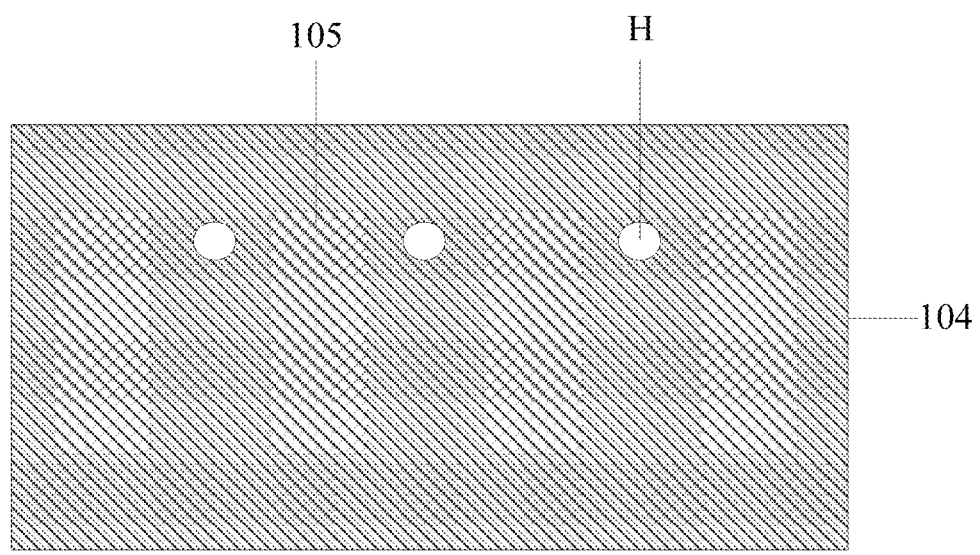
Figure 14:
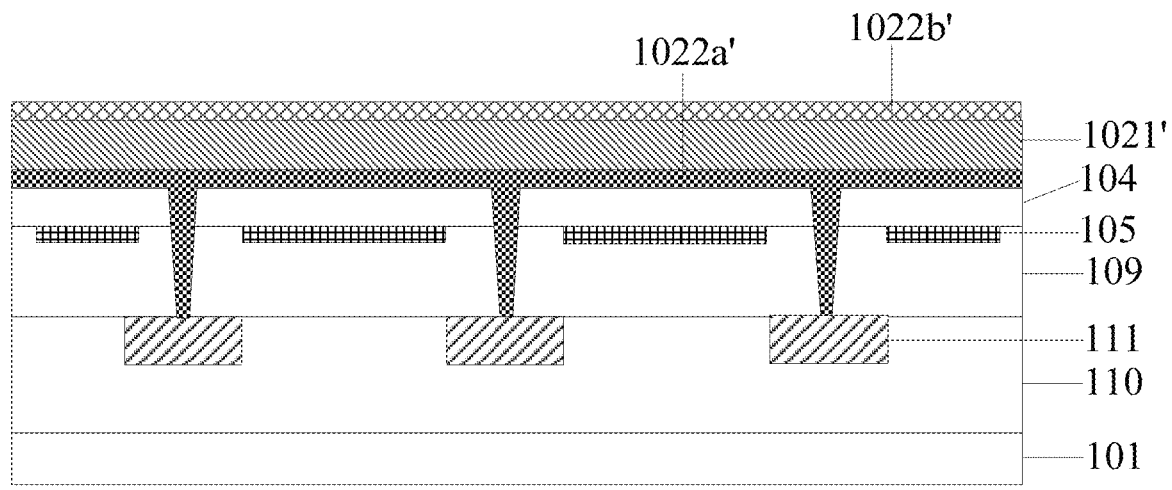
Figure 15:
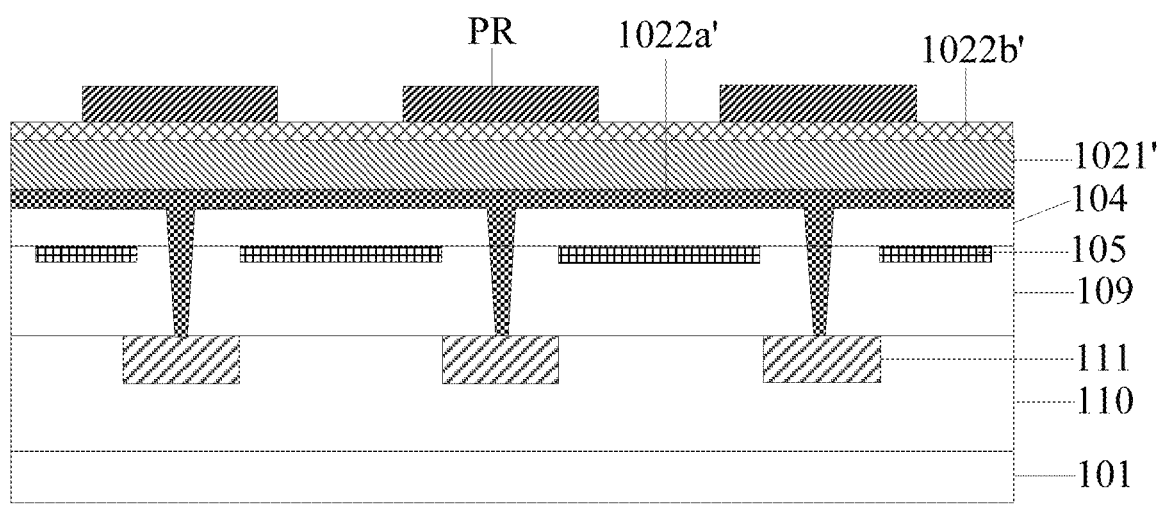
Figure 16:
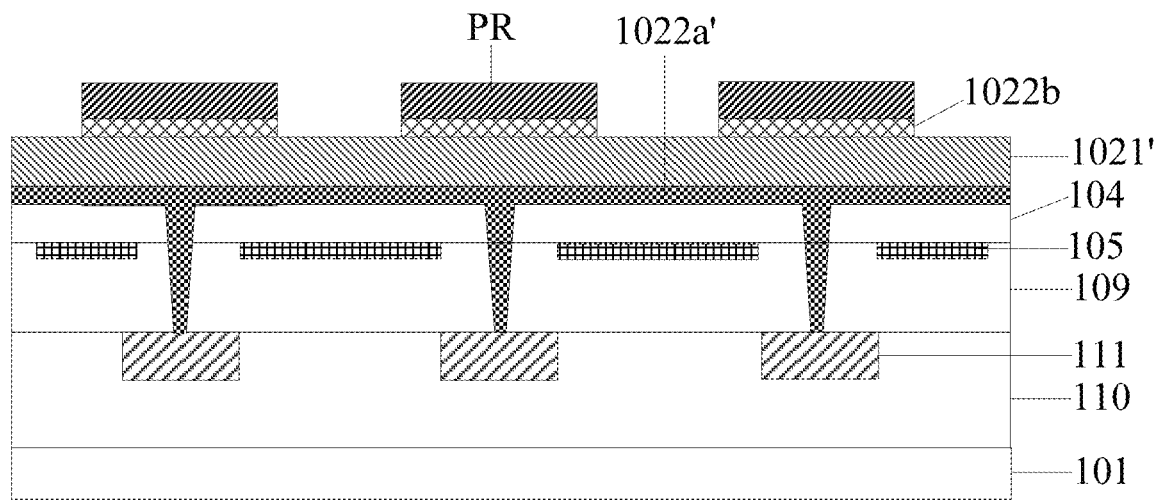
Figure 17:
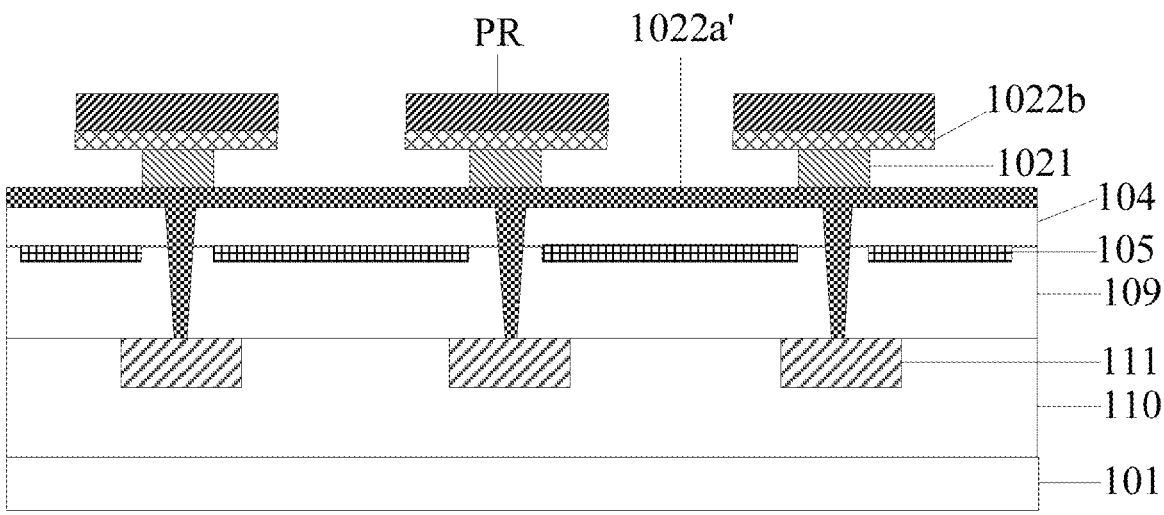
Figure 18:
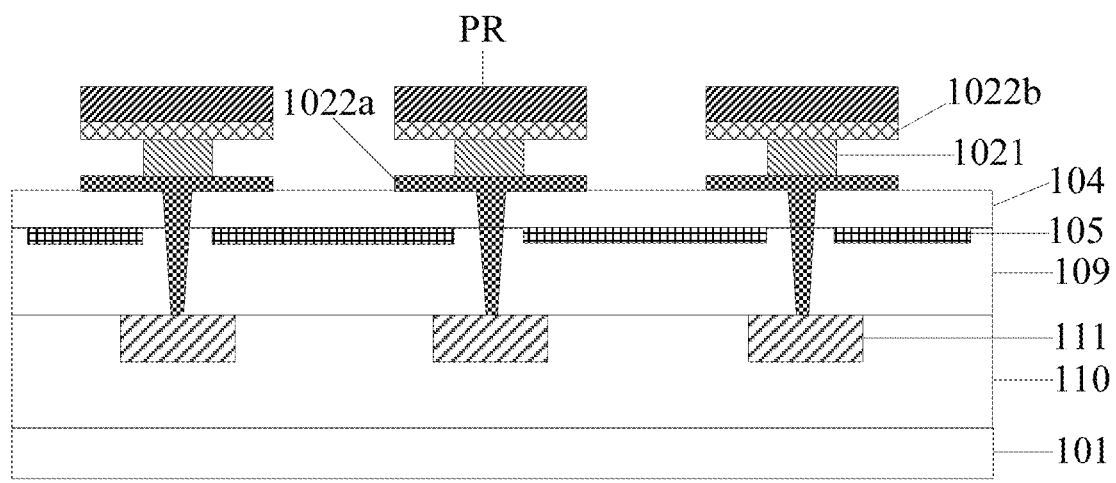
Figure 19:
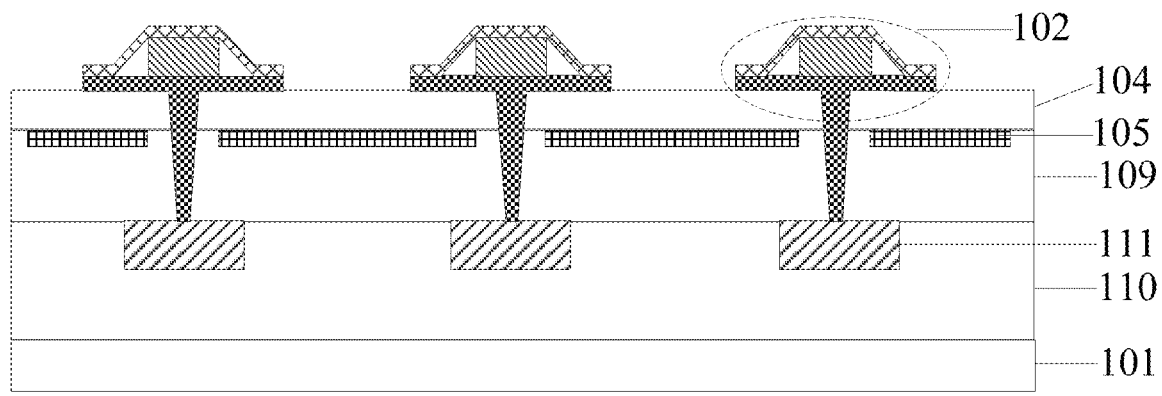
Figure 20:
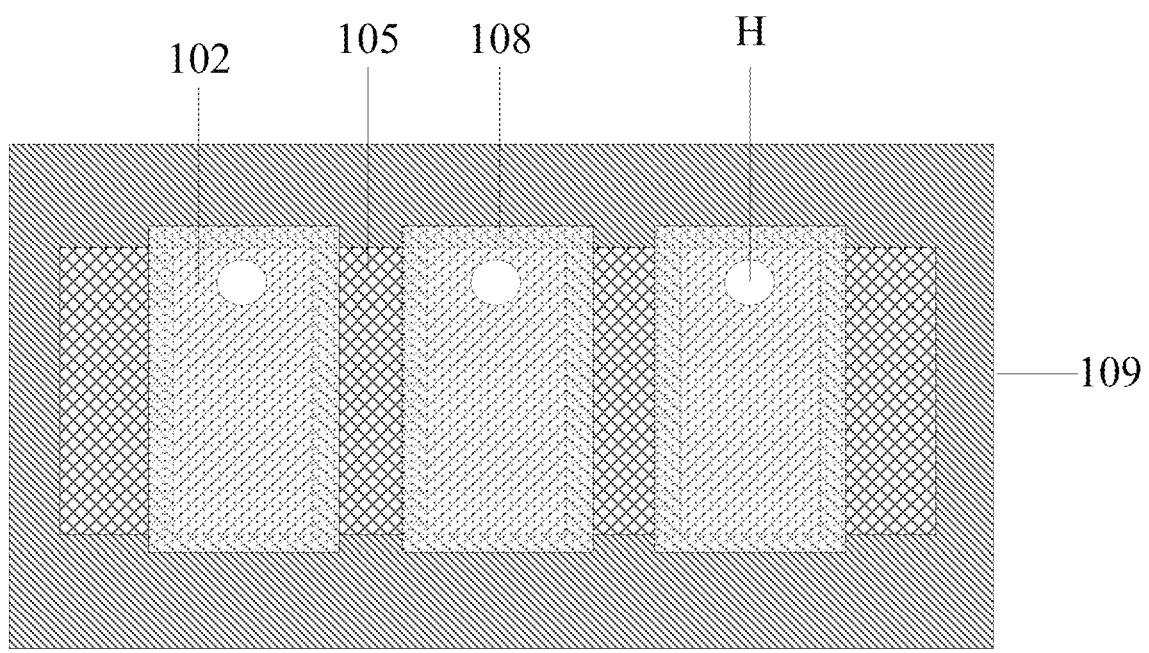
Figure 21:
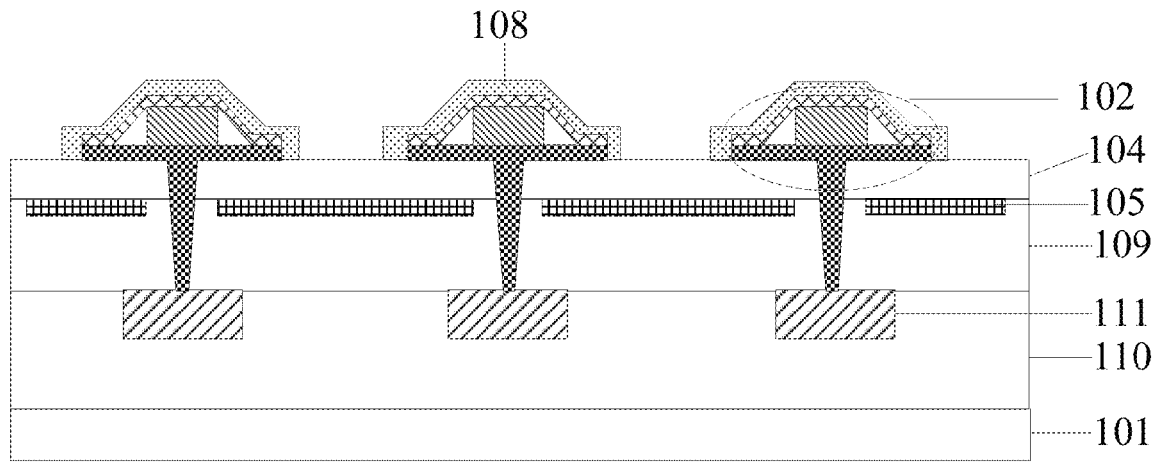
Figure 22:
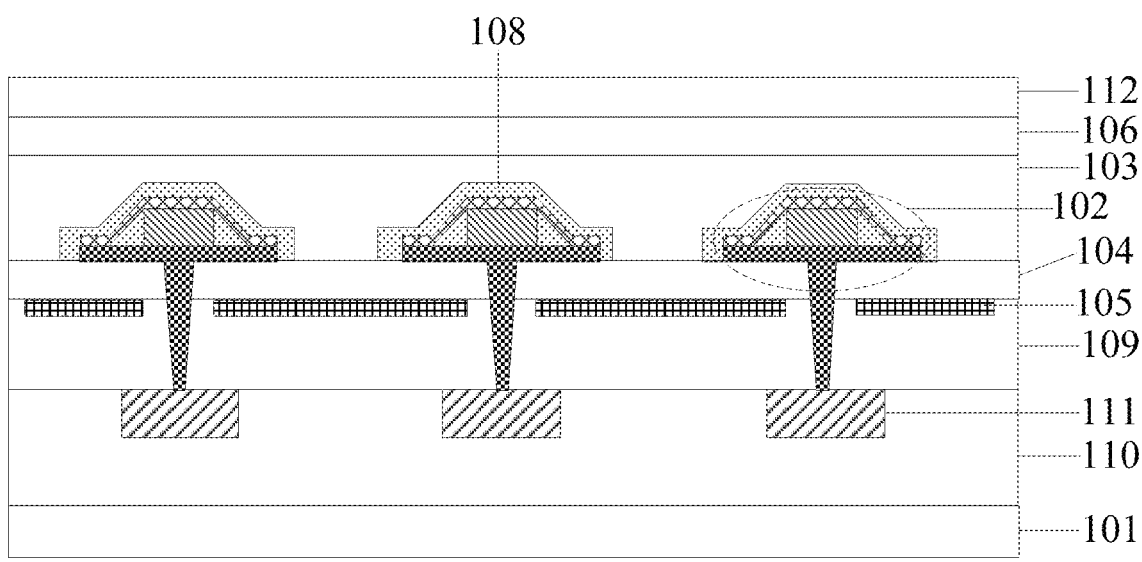

1, a plurality of pixel driving circuits 110 and a planarization layer 109 are formed in sequence on the base substrate 101, wherein a driving transistor in each pixel driving circuit 110 has a source/drain electrode 111, and the planarization layer 109 has a plurality of grooves C and via holes H, as shown in FIG. 8 and FIG. 9.
2, the reflective structures 105 are formed in the grooves C of the planarization layer 109 in a one-to-one corresponding mode, as shown in FIG. 10 and FIG. 11.
3, the insulation layer 104 is formed on the side of the reflective structures 105 facing away from the base substrate 101, and the via holes H running through the insulation layer 104 and the planarization layer 109 are formed by patterning, as shown in FIG. 12 and FIG. 13.
4, a first transparent conductive material layer 1022a', a reflective conductive material layer 1021' and a second transparent conductive material layer 1022b' are formed on the insulation layer 104, as shown in FIG. 14.
5, a patterned photoresist layer PR is formed on the second transparent conductive material layer 1022b', an orthographic projection of the photoresist layer PR on the base substrate 101 overlaps with a gap of the reflective structures 105 and an edge of an orthographic projection of the reflective structures 105, as shown in FIG. 15.
6, the photoresist layer PR is used as a mask, and the second transparent conductive material layer 1022b' is etched, so that a plurality of second transparent conductive portions 1022b are formed, as shown in FIG. 16. The reflective conductive material layer 1021' continues to be etched, so that a plurality of reflective conductive portions 1021 are formed, as shown in FIG. 17. The first transparent conductive material layer 1022a continues to be etched, so that a plurality of first transparent conductive portions 1022a are formed, as shown in FIG. 18.
7, photoresist PR is stripped off, so preparation of the first electrodes 102 is completed. It should be understood that as the portion of the second transparent conductive portion 1022b exceeding the reflective conductive portion 1021 has no support of the reflective conductive portion 1021, the portion of the second transparent conductive portion 1022b exceeding the reflective conductive portion 1021 forms a slope due to gravity effect to be in contact with the first transparent conductive portion 1022a, as shown in FIG. 19 and FIG. 20.
8, a plurality of transparent protective electrodes 108 are formed on the layer where the first electrodes 102 are located, as shown in FIG. 21.
9, a light-emitting function layer 103, a second electrode 106 and an encapsulation layer 112 are sequentially formed on a layer where the transparent protective electrodes 108 are located, as shown in FIG. 22. In some embodiments, the light-emitting function layer 103 may be prepared in a mode of evaporation or printing.

It needs to be noted that in the above manufacturing method provided by the embodiment of the present disclosure, patterning processes involved in forming all layers of structures may not only include a part of or all of processes such as deposition, photoresist coating, mask process, exposure, developing, etching and photoresist stripping, but also include other processes, which is specifically determined according to needed patterns formed in an actual manufacturing process and is not limited herein. For example, a post-baking process may be further included after developing and before etching.

The deposition process may be a chemical vapor deposition method, a plasma enhanced chemical vapor deposition method or a physical vapor deposition method, which is not limited herein. A mask used in the masking process may be a Half Tone Mask, a Single Slit Mask or a Gray Tone Mask, which is not limited. Etching may be dry etching or wet etching, which is not limited herein.

Figure 23:
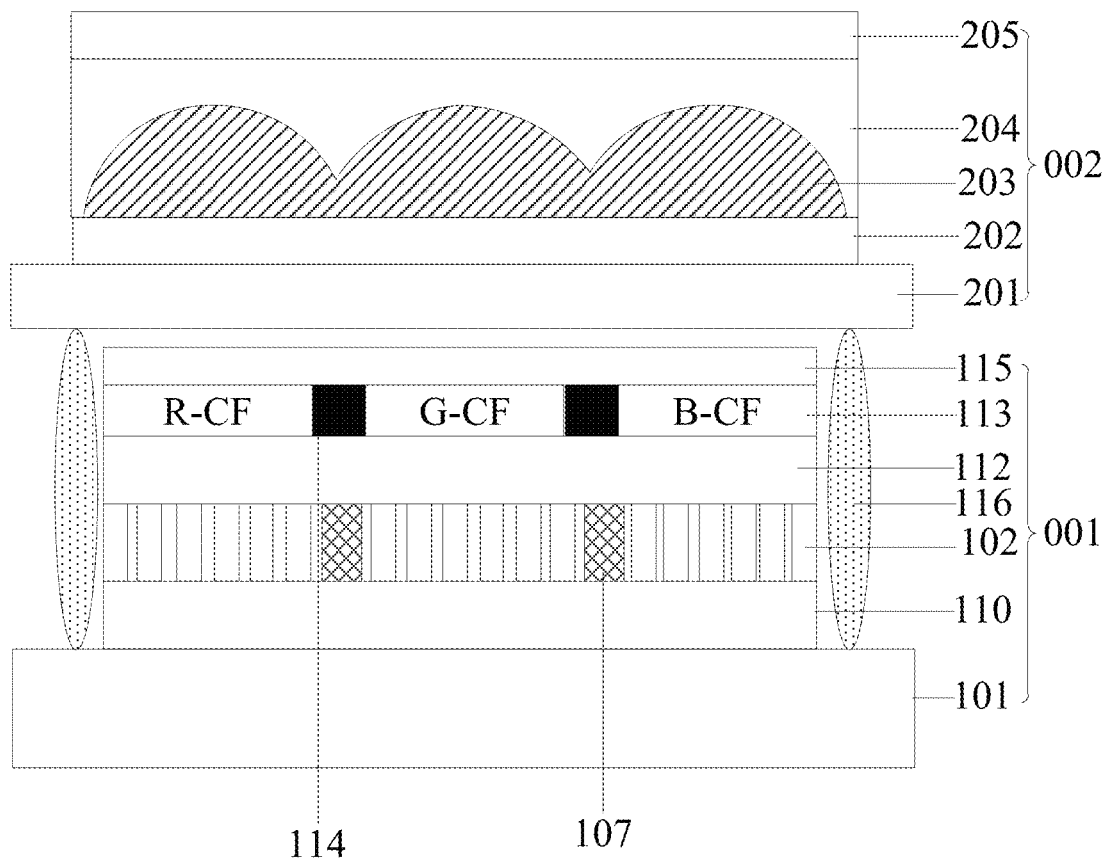
FIG. 23 is a schematic structural diagram of a display apparatus provided by an embodiment of the present disclosure.

Based on the same inventive concept, an embodiment of the present disclosure further provides a three-dimensional display apparatus, as shown in FIG. 23, includes the above display substrate 001 and a spectrometer 002 disposed on a display side of the display substrate 001. As a principle of solving problems of the three-dimensional display apparatus is similar to the principle of solving problems of the above display substrate, implementation of the three-dimensional display apparatus provided by the embodiment of the present disclosure may refer to implementation of the above display substrate provided by the embodiment of the present disclosure, and repetitions are not described in detail.

In some embodiments, as shown in FIG. 23, the spectrometer 002 may include a glass substrate 201, a base material 202 and a high-refractive-index resin layer 203, a low-refractive-index resin layer 204 and a protective film 205. The display substrate 001 may be further provided with a color photoresist layer 113 (including but is not limited to a red light color filter R-CF, a green light color filter G-CF and a blue light color filter B-CF), a black matrix 114, a protective cover plater 115 and a blocking dam 116. Besides, in some medium and small size products, a light-emitting device to which the first electrode 102 below the red light color filter R-CF belongs is a red light-emitting device, a light-emitting device to which the first electrode 102 below the green light color filter G-CF belongs is a green light-emitting device, and a light-emitting device to which the first electrode 102 below the blue light color filter B-CF belongs is a blue light-emitting device. In some medium and large size products, light-emitting devices to which all first electrodes 102 belong may be white light-emitting devices.

It needs to be noted that the high-refractive-index 203 is composed of a plurality of cylindrical lenses, each of the cylindrical lenses may separate light beams from the light-emitting device to which the first electrode 102 covered by it belongs. Besides, though continuous light-emitting is realized in one sub-pixel P, brightness of the light-emitting device to which the first electrode 102 belongs is larger than brightness of the gap between the first electrodes 102, and based on the above factors, the above solutions provided by the present disclosure can improve unfavorable moire and will not affect a 3D display effect.

Apparently, those skilled in the art can make various changes and transformations to the embodiments of the present disclosure without departing from the spirit and scope of the embodiments of the present disclosure. In this case, if these changes and transformations of the embodiments of the present disclosure fall within the scope of the claims and their equivalents of the present disclosure, the present disclosure also intends to include these changes and transformations.

What is claimed is:

1. A display substrate, comprising:
   a base substrate;
   a plurality of sub-pixels, wherein in each of the plurality of sub-pixels, at least two first electrodes and a light-emitting function layer disposed on a side of the at least two first electrodes facing away from the base substrate are provided; and each of the at least two electrodes comprises: a transparent conductive portion and a reflective conductive portion arranged in a stack;
   an insulation layer, disposed between a layer where the at least two first electrodes are located and the base substrate; and
   a plurality of reflective structures, located between the insulation layer and the base substrate;
   wherein
   in at least one of the plurality of sub-pixels, two adjacent first electrodes are correspondingly provided with one of the plurality of reflective structures;
   the one of the plurality of reflective structures comprises a first portion and a second portion, an orthographic projection of the first portion on the base substrate and an orthographic projection of one of the two adjacent first electrodes on the base substrate have an overlap area, and an orthographic projection of the second portion on the base substrate and an orthographic projection of another one of the two adjacent first electrodes on the base substrate have an overlap area;
   wherein the one of the plurality of reflective structures further comprises a third portion;
   a distance between the third portion and the light-emitting function layer in a direction perpendicular to the base substrate is smaller than a distance between the first portion and the light-emitting function layer in the direction perpendicular to the base substrate, and smaller than a distance between the second portion and the light-emitting function layer in the direction perpendicular to the base substrate.

2. The display substrate according to claim 1, wherein the third portion is located between the first portion and the second portion.

3. The display substrate according to claim 1, wherein an orthographic projection of the reflective conductive portion on the base substrate is located within an orthographic projection of the transparent conductive portion on the base substrate.

4. The display substrate according to claim 3, wherein the transparent conductive portion comprises: a first transparent conductive portion disposed on a side of the reflective conductive portion facing the base substrate, and a second transparent conductive portion disposed on a side of the reflective conductive portion facing away from the base substrate, wherein
   a portion of the second transparent conductive portion exceeding the reflective conductive portion comprises:
     a slope obliquely extending towards the base substrate; and
     an edge flat portion in contact with the slope.

5. The display substrate according to claim 4, further comprising: a plurality of transparent protective electrodes disposed on a side of the layer where the plurality of first electrodes are located facing away from the base substrate, wherein
   the plurality of transparent protective electrodes correspond to the plurality of first electrodes; and
   an orthographic projection of one of the plurality of transparent protective electrode on the base substrate at least covers an orthographic projection of an edge flat portion in a corresponding first electrode on the base substrate.

6. The display substrate according to claim 5, wherein
   in each of the plurality of sub-pixels, the at least two first electrodes are arranged in a first direction and extend in a second direction; and
   a width of the transparent protective electrode in the first direction is larger than or equal to a width of the corresponding first electrode in the first direction; and
   a length of the transparent protective electrode in the second direction is larger than or equal to a length of the corresponding first electrode in the second direction.

7. The display substrate according to claim 1, further comprising:
   a planarization layer disposed between the base substrate and a layer where the plurality of reflective structures are located; wherein, the reflective structures are arranged in grooves of the planarization layer.

8. The display substrate according to claim 7, further comprising: a plurality of pixel driving circuits located between the base substrate and the planarization layer, wherein
the pixel driving circuits are corresponding electrically connected to the first electrodes through via holes running through the insulation layer and the planarization layer.

9. The display substrate according to claim 8, wherein the via holes are sequentially arranged in the first direction and are at edges of a same side of corresponding first electrodes.

10. The display substrate according to claim 1, wherein in a direction perpendicular to the base substrate, a thickness of the reflective conductive portion is larger than or equal to 200 Å and smaller than or equal to 2000 Å.

11. The display substrate according to claim 4, wherein at a side close to the reflective conductive portion, an included angle between the slope and the base substrate is larger than or equal to 30° and smaller than or equal to 60°.

12. The display substrate according to claim 5, wherein in each of the plurality of sub-pixels,
a maximum distance between the first portion and the second portion is larger than 2 μm and smaller than or equal to 5 μm;
a minimum distance between the first portion and the second portion is larger than 1 μm and smaller than or equal to 2 μm; and
a gap between the transparent protective electrodes is larger than 0 μm and smaller than or equal to 2 μm.

13. The display substrate according to claim 1, wherein a material of the insulation layer is an inorganic insulation material.

14. A three-dimensional display apparatus, comprising:
a display substrate; and
a spectrometer disposed on a display side of the display substrate;
wherein the display substrate comprises:
a base substrate; wherein
the base substrate comprises a plurality of sub-pixels, in each of the plurality of sub-pixels, at least two first electrodes and a light-emitting function layer disposed on a side of the at least two first electrodes facing away from the base substrate are provided; and each of the at least two electrodes comprises: a transparent conductive portion and a reflective conductive portion arranged in a stack;
an insulation layer, disposed between a layer where the at least two first electrodes are located and the base substrate; and
a plurality of reflective structures, located between the insulation layer and the base substrate;
wherein
in at least one of the plurality of sub-pixels, two adjacent first electrodes are correspondingly provided with one of the plurality of reflective structures;
the one of the plurality of reflective structures comprises a first portion and a second portion, an orthographic projection of the first portion on the base substrate and an orthographic projection of one of the two adjacent first electrodes on the base substrate have an overlap area, and an orthographic projection of the second portion on the base substrate and an orthographic projection of another one of the two adjacent first electrodes on the base substrate have an overlap area;
wherein the one of the plurality of reflective structures further comprises a third portion;
a distance between the third portion and the light-emitting function layer in a direction perpendicular to the base substrate is smaller than a distance between the first portion and the light-emitting function layer in the direction perpendicular to the base substrate, and smaller than a distance between the second portion and the light-emitting function layer in the direction perpendicular to the base substrate.

15. The three-dimensional display apparatus according to claim 14, wherein an orthographic projection of the reflective conductive portion on the base substrate is located within an orthographic projection of the transparent conductive portion on the base substrate.

16. A manufacturing method of the display substrate according to claim 1, comprising:
providing the base substrate;
forming the plurality of reflective structures on the base substrate;
forming the insulation layer on a layer where the plurality of reflective structures are located; and
forming the plurality of sub-pixels on the insulation layer.

17. The manufacturing method according to claim 16, wherein the forming the plurality of first electrodes comprises:
forming a first transparent conductive material layer, a reflective conductive material layer and a second transparent conductive material layer on the insulation layer in sequence; and
etching the first transparent conductive material layer, the reflective conductive material layer and the second transparent conductive material layer by using a same etching process so as to form a plurality of first electrodes;
wherein each first electrode comprises the first transparent conductive portion, the reflective conductive portion and the second transparent conductive portion, wherein a portion of the second transparent conductive portion exceeding the reflective conductive portion comprises: a slope obliquely extending towards the base substrate, and an edge flat portion in contact with the slope; and in the same sub-pixel, all the at least two first electrodes are arranged in the first direction and extend in the second direction.

18. The manufacturing method according to claim 16, wherein after forming the plurality of first electrodes and before forming the light-emitting function layer, the method further comprises:
forming a plurality of transparent protective electrodes on a side of a layer where the first electrodes are located facing away from the base substrate;
wherein the plurality of transparent protective electrodes correspond to the plurality of first electrodes;
a width of the transparent protective electrode in a first direction is larger than a width of a corresponding first electrode in the first direction; and
a length of the transparent protective electrode in a second direction is larger than a length of the corresponding first electrode in the second direction.

* * * * *